US011136985B2

(12) United States Patent
Prine et al.

(10) Patent No.: US 11,136,985 B2
(45) Date of Patent: Oct. 5, 2021

(54) HIGH FREQUENCY AC NOISE SUPPRESSION WITHIN TRANSFORMERS

(71) Applicant: Baker Hughes, Houston, TX (US)

(72) Inventors: Blayne Prine, Tulsa, OK (US); Gordon Besser, Tulsa, OK (US); Gary Williams, Tulsa, OK (US); Craig Cooper, Inola, OK (US); Vernon Chronister, Tulsa, OK (US); Jeremy Hillshafer, Tulsa, OK (US)

(73) Assignee: Baker Hughes, a GE Company, LLC, Houston, TX (US)

( * ) Notice: Subject to any disclaimer, the term of this patent is extended or adjusted under 35 U.S.C. 154(b) by 16 days.

(21) Appl. No.: 16/558,102

(22) Filed: Aug. 31, 2019

(65) Prior Publication Data

US 2020/0072228 A1 Mar. 5, 2020

Related U.S. Application Data

(60) Provisional application No. 62/725,460, filed on Aug. 31, 2018.

(51) Int. Cl.

| | |
|---|---|
| ***H02M 3/28*** | (2006.01) |
| ***F04D 15/00*** | (2006.01) |
| ***E21B 43/12*** | (2006.01) |
| ***H01F 30/06*** | (2006.01) |
| ***H01F 27/28*** | (2006.01) |
| ***G01R 31/50*** | (2020.01) |
| *H02M 1/12* | (2006.01) |

(52) U.S. Cl.

CPC ........ *F04D 15/0066* (2013.01); *E21B 43/128* (2013.01); *G01R 31/50* (2020.01); *H01F 27/28* (2013.01); *H01F 30/06* (2013.01); *H02M 3/28* (2013.01); *H02M 1/123* (2021.05)

(58) Field of Classification Search

CPC ... H02M 2001/123; H02M 3/28; H01F 30/06; H01F 27/28; H04B 3/54; H04B 3/546; F04D 13/08; F04D 15/0066; H04D 1/06; E21B 43/128; E21B 47/122; G01R 31/50

See application file for complete search history.

(56) References Cited

U.S. PATENT DOCUMENTS 5,689,180 A 11/1997 Carlson
6,121,765 A 9/2000 Carlson
(Continued)

FOREIGN PATENT DOCUMENTS

EP 0870353 B1 9/2004
JP 6154879 S 3/1986
(Continued)

OTHER PUBLICATIONS

International Search Report and Written Opinion issued in connection with corresponding PCT Application No. PCT/US2019/049375 dated Dec. 13, 2019.

*Primary Examiner* — Adolf D Berhane

(74) *Attorney, Agent, or Firm* — Crowe & Dunlevy, P.C.

(57) ABSTRACT

A transformer configured for use in connection with a variable speed motor drive includes primary windings and secondary windings. The secondary windings are configured as wye-windings and a ground lead and a plurality of phase leads. The transformer includes a ferrite blocking circuit connected to the ground lead.

9 Claims, 3 Drawing Sheets

106 122 120 124 126 128 114 118 104 102 116 108 100 112 110

(56) References Cited

U.S. PATENT DOCUMENTS

| | | | | |
|---|---|---|---|---|
| 8,106,791 | B2 * | 1/2012 | Thompson | G01V 11/002 340/854.3 |
| 9,347,311 | B2 * | 5/2016 | Xiao | H04B 3/54 |
| 9,985,690 | B2 * | 5/2018 | Rendusara | F04D 13/10 |
| 10,103,112 | B2 * | 10/2018 | Ishiwata | H05K 1/0233 |
| 2005/0146226 | A1 * | 7/2005 | Trainer | H02M 1/4233 307/73 |
| 2008/0253230 | A1 | 10/2008 | Thompson et al. | |
| 2012/0037354 | A1 | 2/2012 | McCoy et al. | |
| 2015/0029036 | A1 | 1/2015 | Xiao et al. | |
| 2016/0006481 | A1 | 1/2016 | Rendusara et al. | |
| 2017/0323861 | A1 | 11/2017 | Ishiwata | |
| 2020/0177092 | A1 * | 6/2020 | Ledezma | H02M 5/4585 |

FOREIGN PATENT DOCUMENTS

| | | | |
|---|---|---|---|
| JP | 2010161696 | A | 7/2010 |
| WO | 2009044514 | A1 | 7/2002 |
| WO | 2018075037 | A1 | 4/2018 |

* cited by examiner

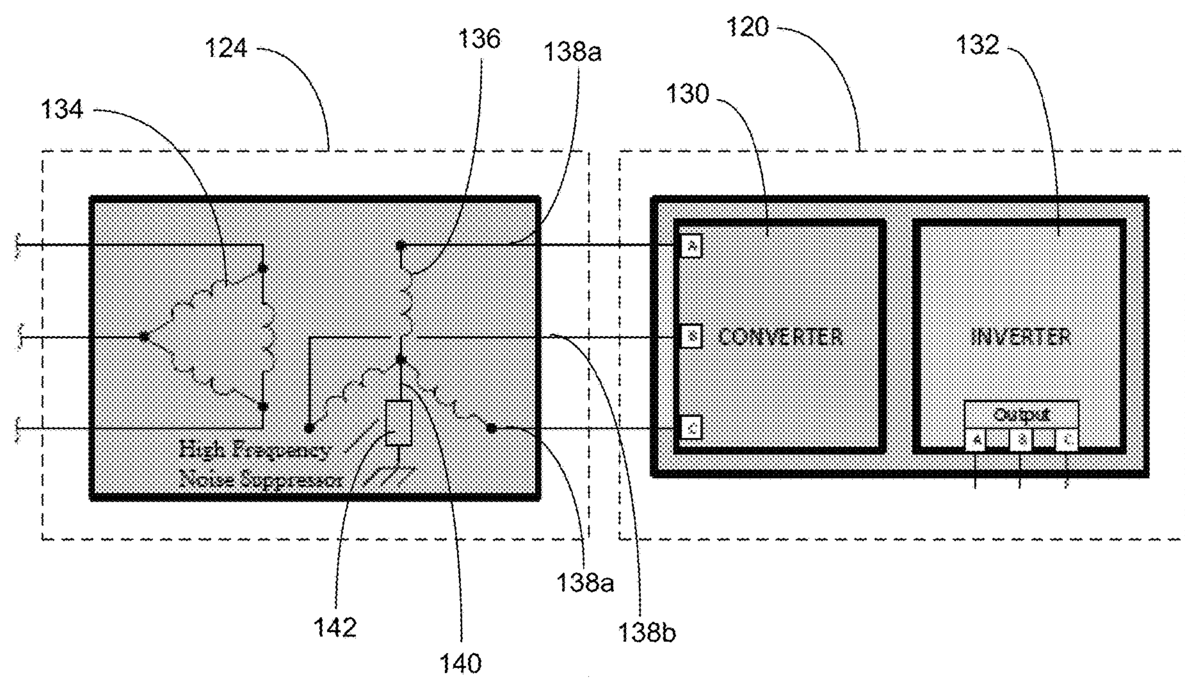
FIG. 2
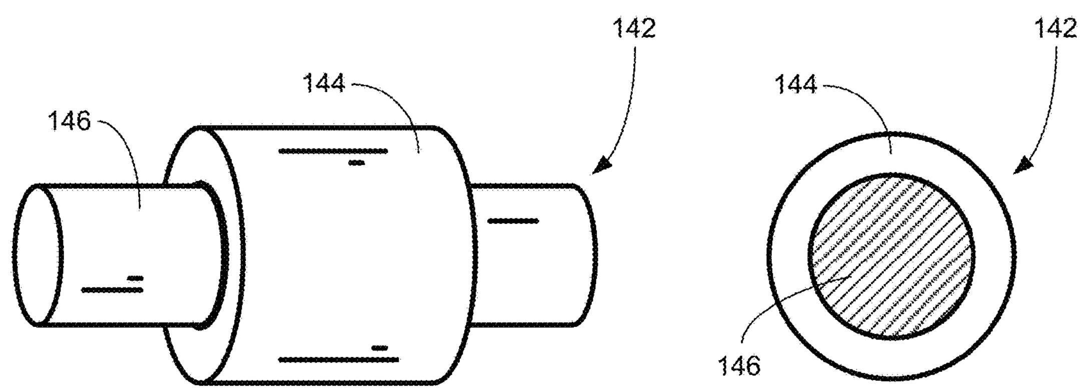
FIG. 3
FIG. 4

HIGH FREQUENCY AC NOISE SUPPRESSION WITHIN TRANSFORMERS

RELATED APPLICATIONS

This application claims the benefit of U.S. Provisional Patent Application Ser. No. 62/725,460 entitled "High Frequency AC Noise Suppression within Transformers," filed Aug. 31, 2018, the disclosure of which is herein incorporated by reference.

FIELD OF THE INVENTION

This invention relates generally to power supply systems, and more particularly, but not by way of limitation, to an improved transformer for providing power to an electric pumping system.

BACKGROUND

Pumping systems are often deployed into wells to recover petroleum fluids from subterranean reservoirs. Typically, the submersible pumping system includes a number of components, including one or more electric motors coupled to one or more high performance pumps. Each of the components and sub-components in a submersible pumping system is engineered to withstand the inhospitable downhole environment, which includes wide ranges of temperature, pressure and corrosive well fluids.

The electric motor is often driven by a variable speed drive located on the surface. The variable speed drive produces an alternating current that is transferred to the electric motor through a power cable. In some applications, the voltage of the current provided by the variable speed drive to the motor must be increased by a step-up transformer to reach the design voltage for the electric motor. In other applications, transformers are used to adjust the input voltage to the variable speed drive.

Inductors are sometimes used to create a reactance ground on transformers. To comply with ratings established by the International Electrotechnical Commission (IEC), inductors placed on the ground lead of transformers must be configured to handle electrical shorts. Often, this requires the conductor of the inductor to be oversized to minimize temperature increases in the event of a short circuit. Additionally, when an inductor is used with transformer, a ground fault indicator (GFI) must be used to verify that the equipment is properly ground referenced. The use of oversized conductors and ground fault indicators increases cost and complexity to the transformers. It is to these and other deficiencies in the prior art that the present invention is directed.

SUMMARY OF THE INVENTION

In some embodiments, the present invention includes a transformer that has primary windings and secondary windings, where the secondary windings include a ground lead and a plurality of phase leads. The transformer also includes a ferrite blocking circuit connected to the ground lead.

In another aspect, the present invention provides a pumping system that has an electric motor, a power supply, a variable speed drive, and a transformer connected to the variable speed drive. The transformer includes primary windings and secondary windings, where the secondary windings include a ground lead. The transformer further includes a ferrite blocking circuit connected to the ground lead of the secondary windings.

In yet another embodiment, the present invention includes a transformer that has primary windings and secondary windings, where the secondary windings include a ground lead and a plurality of phase leads. The transformer further includes a ferrite blocking circuit connected to the ground lead, where the ferrite blocking circuit has a ferrite element and a conductor coupled to the ground lead and extending through the ferrite element.

BRIEF DESCRIPTION OF THE DRAWINGS

FIG. 2 is a functional depiction of an input transformer connected to the variable speed drive of FIG. 1.

FIG. 3 is a perspective view of a first embodiment of the ferrite blocking circuit from the input transformer of FIG. 2.

FIG. 4 is an end view of the ferrite blocking circuit of FIG. 3.

WRITTEN DESCRIPTION

Figure 1:
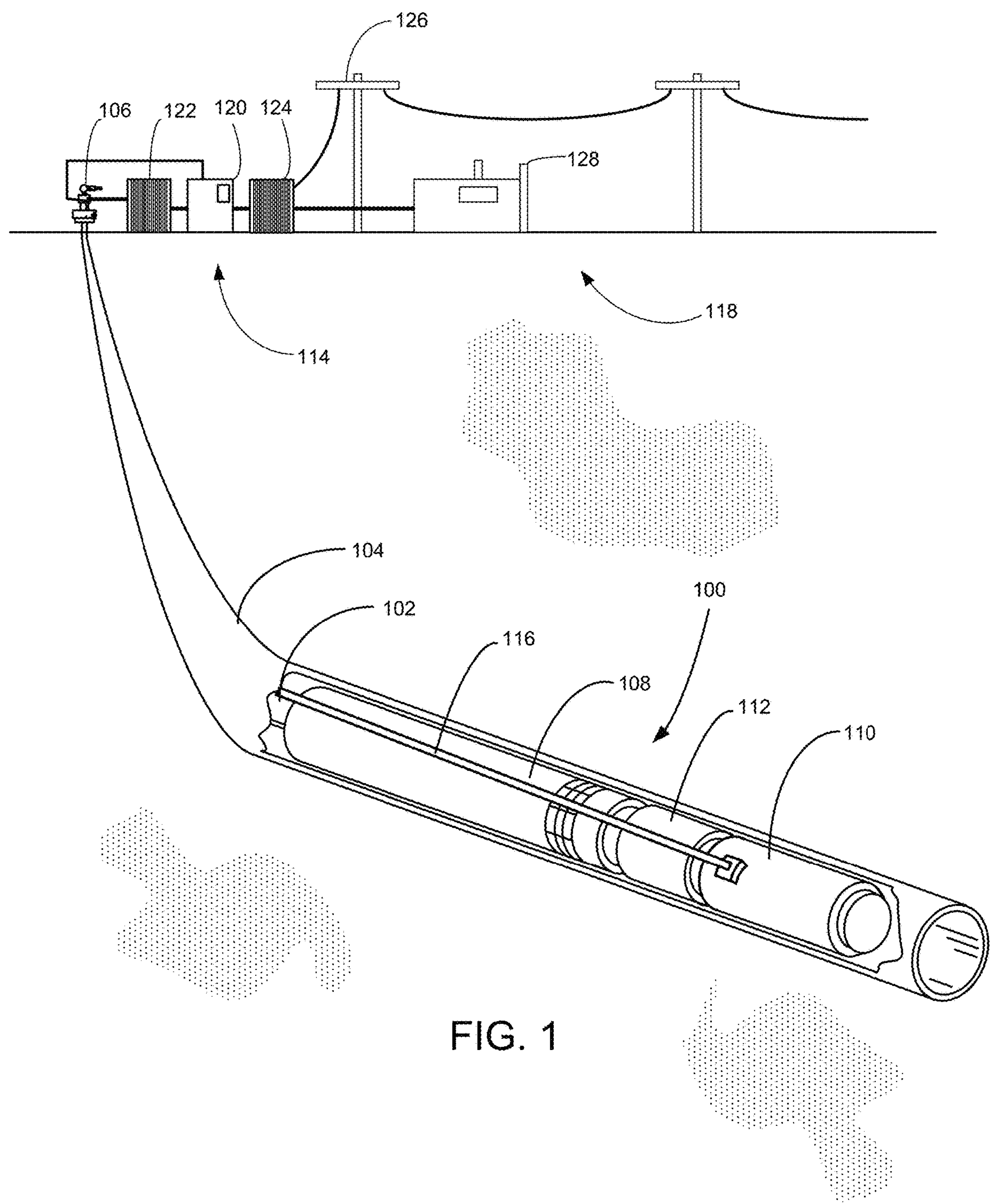
FIG. 1 is a perspective view of a pumping system constructed in accordance with an exemplary embodiment.

In accordance with exemplary embodiments of the present invention, FIG. 1 shows a perspective view of a pumping system 100 attached to production tubing 102. The pumping system 100 and production tubing 102 are disposed in a wellbore 104, which is drilled for the production of a fluid such as water or petroleum. As used herein, the term "petroleum" refers broadly to all mineral hydrocarbons, such as crude oil, gas and combinations of oil and gas. The production tubing 102 connects the pumping system 100 to a wellhead 106 located on the surface. Although the pumping system 100 is primarily designed to pump petroleum products, it will be understood that the present invention can also be used to move other fluids. It will also be understood that, although the pumping system 100 of FIG. 1 is depicted in a deviated or non-vertical wellbore 104, the pumping system 100 and methods disclosed herein will find also utility in traditional vertical wellbores.

The pumping system 100 includes a pump 108, a motor 110 and a seal section 112. The motor 110 is an electric motor that receives power from surface facilities 114 through a power cable 116. When energized, the motor 110 drives a shaft (not shown) that causes the pump 108 to operate. The seal section 112 shields the motor 110 from mechanical thrust produced by the pump 108 and provides for the expansion of motor lubricants during operation. The seal section 112 also isolates the motor 110 from the wellbore fluids passing through the pump 108.

The surface facilities 114 provide power and control to the motor 110. The surface facilities 114 include a power source 118, a variable speed drive (VSD) 120 and a step-up transformer 122 and an input transformer 124. The power source 118 includes one or both of a public electric utility 126 and an independent electrical generator 128. Electricity is fed by the power source 118, through the input transformer 124 to the variable speed drive 120. It will be appreciated that in some applications, it may not be necessary to deploy both the step-up transformer 122 and the input transformer 124.

Turning to FIG. 2, shown therein is a functional depiction of the input transformer 124 and the variable speed drive 120. The input transformer 124 may be configured as a three-phase transformer that includes a dielectric fluid-filled tank with an input throat and an output throat for making electrical connections with adjacent equipment. The output from the input transformer 124 is carried to the variable speed drive 120. In accordance with well-established motor drive technology, the variable speed drive 120 may include a converter 130 and an inverter 132. The output voltage from the input transformer 124 is coupled to the converter 130, where the alternating current is converted and coupled to a direct current (DC) bus. The inverter 132 is utilized to convert the DC bus voltage to a variable frequency AC signal, in response to motor drive control commands in the variable speed drive 120. In some configurations, the output from the inverter 132 is provided directly to the motor 110 or to the intermediate step-up transformer 122. During normal operation, the variable speed drive 120 can be configured to produce a pulse width modulated (PWM) current at a selected frequency. In some embodiments, the inverter 132 of the variable speed drive 120 is configured to produce a six-step commutation sequence that can be adjusted manually or automatically to adjust the operating parameters of the pumping system 100.

As depicted in FIG. 2, the input transformer 124 is a delta-wye transformer that includes delta-connected primary windings 134 and wye-connected secondary windings 136. In alternate embodiments, the primary windings 134 are also configured as wye-connected windings. The wye-connected secondary windings 136 include phase leads **138*a*, 138*b*, 138*c* and a ground lead 140. The phase leads 138*a*, 138*b*, 138*c* are connected through the output throat to the variable speed drive 120. It will be appreciated that switches, sensors, fans and other customary equipment may be included within the input transformer 124**.

Unlike prior art designs in which the ground lead of a transformer is provided with an inductor, the input transformer 124 includes a ferrite blocking circuit 142 connected to the ground lead 140. The ferrite blocking circuit 142 is configured as a high-frequency, noise-absorbing and blocking circuit that is connected in parallel with the ground lead 140 or connected in series with the ground lead 140.

Figure 5:
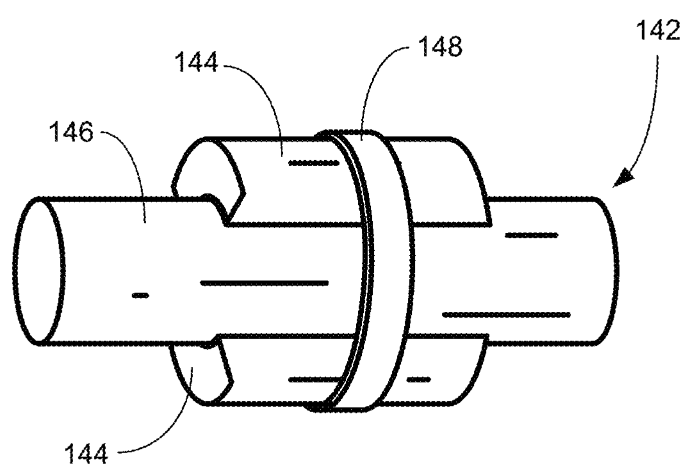
FIG. 5 is a perspective view of a second embodiment of the ferrite blocking circuit from the input transformer of FIG. 2.
Figure 6:
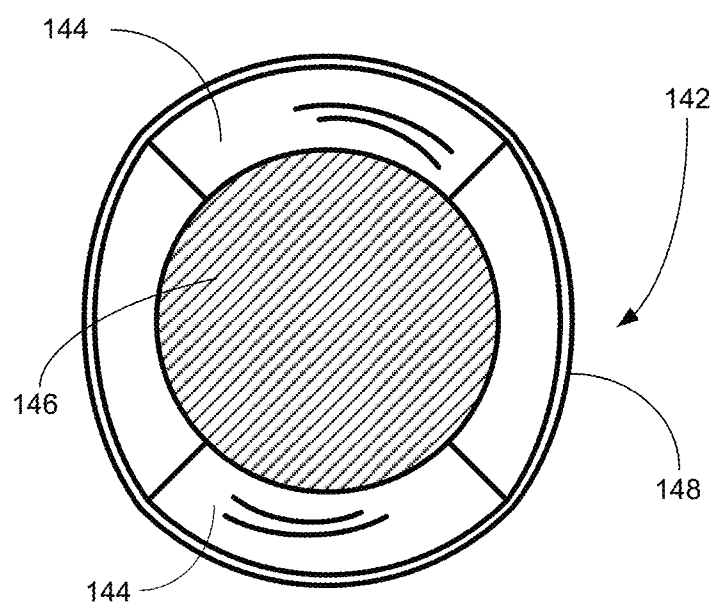
FIG. 6 is an end view of the ferrite blocking circuit of FIG. 5.

In an exemplary embodiment depicted in FIGS. 3 and 4, the ferrite blocking circuit 142 includes a ferrite element 144 through which a conductor 146 extends. As depicted in FIGS. 3 and 4, the ferrite element 144 is a ferrite cylindrical body that surrounds a portion of the conductor 146. In other embodiments depicted in FIGS. 5 and 6, the ferrite element 144 includes one or more ferrite rectangular or prism bodies that are connected to, or in close proximity with, the conductor 146 and that extend in a substantially parallel orientation with the conductor 146. In the embodiment depicted in FIGS. 5 and 6, the ferrite element 144 can be secured to an exterior surface of the conductor 146 with banding 148.

The ferrite blocking circuit 142 on the ground lead 140 provides noise-filtering without impeding the AC signal, without resistive or reactive losses, and without generating temperature during operation. Unlike prior art inductors, the ferrite blocking circuit 142 does not make use of looped conductors, which raise compliance issues with IEC standards and require ground fault indicators.

Although the ferrite blocking circuit 142 is disclosed in connection with the input transformer 124, it will be appreciated that the ferrite blocking circuit 142 could also be applied to the ground lead 140 within the step-up transformer 122. Additionally, it will be appreciated that the combination of the ferrite blocking circuit 142 and ground lead 140 could be applied to wye-connected windings in other transformers, including in industrial power applications.

It is to be understood that even though numerous characteristics and advantages of various embodiments of the present invention have been set forth in the foregoing description, together with details of the structure and functions of various embodiments of the invention, this disclosure is illustrative only, and changes may be made in detail, especially in matters of structure and arrangement of parts and steps within the principles of the present invention to the full extent indicated by the broad general meaning of the terms in which the appended claims are expressed. It will be appreciated by those skilled in the art that the teachings of the present invention can be applied to other systems without departing from the scope and spirit of the present invention.

What is claimed is:

1. A transformer comprising:
primary windings;
secondary windings, wherein the secondary windings include a ground lead and a plurality of phase leads; and
a ferrite blocking circuit connected to the ground lead, wherein the ferrite blocking circuit comprises:
a ferrite element;
a conductor coupled to the ground lead and extending through the ferrite element; and
wherein the ferrite element comprises one or more ferrite rectangular bodies secured to an exterior surface of the conductor.

2. The transformer of claim 1, wherein the primary windings are configured in a delta winding configuration.

3. The transformer of claim 1, wherein the primary windings are configured in a wye winding configuration.

4. A pumping system comprising:
an electric motor;
a power supply;
a variable speed drive; and
a transformer connected to the variable speed drive, wherein the transformer comprises:
primary windings;
secondary windings, wherein the secondary windings include a ground lead; and
a ferrite blocking circuit connected to the ground lead of the secondary windings; and
wherein the ferrite blocking circuit comprises:
a ferrite element; and
a conductor coupled to the ground lead and extending through the ferrite element; and
wherein the ferrite element comprises one or more ferrite rectangular bodies secured to an exterior surface of the conductor.

5. The pumping system of claim 4, wherein the transformer is a step-up transformer connected between the variable speed drive and the electric motor.

6. The pumping system of claim 4, wherein the transformer is an input transformer connected between the power supply and the variable speed drive.

7. A transformer comprising:
primary windings;
secondary windings, wherein the secondary windings include a ground lead and a plurality of phase leads; and a ferrite blocking circuit connected to the ground lead, wherein the ferrite blocking circuit comprises:

a ferrite element;

a conductor coupled to the ground lead and extending through the ferrite element; and wherein the ferrite element is coupled to the ground lead in a parallel relationship.

8. The transformer of claim 7, wherein the ferrite element is coupled to the ground lead in a series relationship.

9. The transformer of claim 7, wherein the ferrite element is secured to an exterior surface of the conductor with banding.

* * * * *